United States Patent [19]

Neumann

[11] 4,031,533
[45] June 21, 1977

[54] DIFFERENTIAL FLOATING DUAL SLOPE CONVERTER

[75] Inventor: Leopold Neumann, Lexington, Mass.

[73] Assignee: Analogic Corporation, Wakefield, Mass.

[22] Filed: Oct. 2, 1975

[21] Appl. No.: 618,783

[52] U.S. Cl. .................. 340/347 NT; 340/347 AD
[51] Int. Cl.² ...................................... H03K 13/00
[58] Field of Search .............. 340/347 NT, 347 CC, 340/347 AD

[56] References Cited
UNITED STATES PATENTS

| | | | |
|---|---|---|---|
| 3,579,105 | 5/1971 | Scott | 340/347 NT |
| 3,662,845 | 5/1972 | Pratt | 340/347 NT |
| 3,709,309 | 11/1973 | Williams, Jr. et al. | 340/347 NT |
| 3,895,376 | 7/1975 | Uchida | 340/347 NT |

*Primary Examiner*—Malcolm A. Morrison
*Assistant Examiner*—Errol A. Krass
*Attorney, Agent, or Firm*—Weingarten, Maxham & Schurgin

[57] ABSTRACT

For use in an electronic weighing or force measuring system having a load cell providing an output signal representing measured force or weight, a ratiometric analog-to-digital converter operative with a low level differential input signal from the load cell and providing differential sensing of load cell excitation for use as a reference signal and generation of any required offset signal.

13 Claims, 2 Drawing Figures

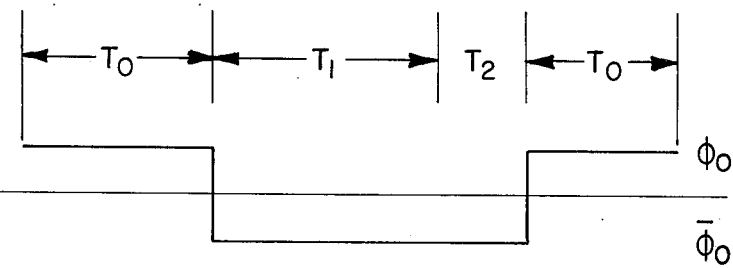

DIFFERENTIAL FLOATING DUAL SLOPE CONVERTER

FIELD OF THE INVENTION

This invention relates to ratiometric analog-to-digital converter circuits and more particularly to a ratiometric low level differential input dual slope converter.

BACKGROUND OF THE INVENTION

Analog-to-digital converters of the dual slope type are known in the art. Low level ratiometric converters of this type are normally single ended in that one side of the analog input signal and one side of the reference signal must be connected to the low level common terminal in an operating system. In a system employing a load cell transducer, as in an electronic weight or force measuring system, use of a single ended converter usually requires a floating excitation supply for the transducer to allow one terminal of the transducer output to be grounded. In addition, a very high input impedance (low input current) differential amplifier must usually be employed to sense the transducer excitation voltage in order to obtain a reference voltage necessary as a converter reference and from which any required offsets are derived.

SUMMARY OF THE INVENTION

According to the invention, there is provided a ratiometric analog-to-digital converter operative with a low level differential input signal from a transducer and providing differential sensing of the excitation for use as a converter reference and from which reference any required offsets are produced. By virtue of the novel converter, no separate floating excitation supply is needed, nor is a separate high input impedance differential amplifier required.

The invention finds particular application in an electronic weighing or force measuring system in which a load cell transducer is excited and produces an analog output signal repesentative of the sensed loading on the cell, which analog signal is converted to digital form for processing and display or other utilization. Although by way of illustration the invention will be described in this context, it will be appreciated that the invention is more broadly useful to provide digital conversion of any differential analog input signal.

DESCRIPTION OF THE DRAWINGS

The invention will be more fully understood from the following detailed description taken in conjunction with the accompanying drawings in which:

FIGS. 2A through 2G are waveforms useful in illustrating operation of the embodiment of FIG. 1.

DETAILED DESCRIPTION OF THE INVENTION

Figure 1:
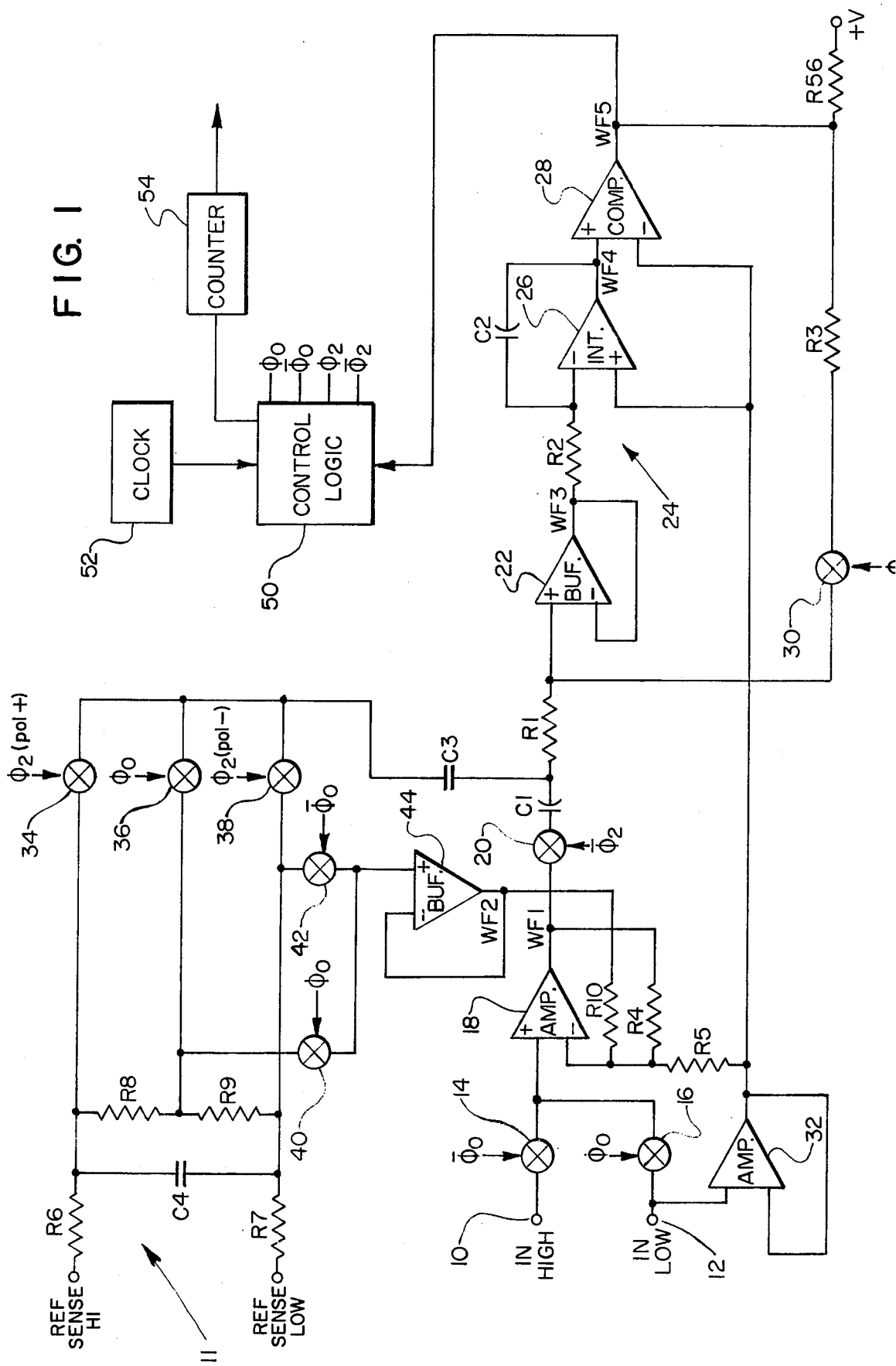
FIG. 1 is a schematic representation of a ratiometric analog-to-digital converter according to the invention.

The invention is shown in typical embodiment in FIG. 1 and includes a pair of input terminals 10 and 12 to which a differential signal is applied from a transducer in a weighing or force measuring system, or from another suitable source. These input terminals are coupled by way of respective electronically controlled switches 14 and 16 to an input of a preamplifier 18. The output of preamplifier 18 is applied via a switch 20 and capacitor C1 and resistor R1 to the positive input of buffer amplifier 22. The buffer amplifier 22 is part of a high input impedance dual slope converter 24 which also includes integrator operational amplifier 26 and comparator 28 connected as shown with integrator input resistor R2 coupling the output of buffer 22 to the negative input of integrator operational amplifier 26 and integrator capacitor C2 coupling the output and the negative input of integrator operational amplifier 26. The output of comparator 28 is coupled via a resistor R3 and switch 30 to the positive input of buffer 22. The input terminal 12 is also coupled to a low input buffer amplifier 32, the output of which is coupled to the positive input of integrator 26 and the negative input of comparator 28 and which amplifier provides a reference signal to converter 24. A resistor R4 interconnects the output and the negative input of amplifier 18 and serves as a gain control therefor. The negative input of amplifier 18 is also coupled via a resistor R5 to the output of low input buffer 32.

A reference voltage is derived from an appropriate source by a center tapped resistor network 11 including resistors R6, R7, R8 and R9 connected as shown in FIG. 1 to respective switches 34, 36 and 38 all commonly coupled via a capacitor C3 to the junction between capacitor C1 and resistor R1. The junction of resistors R8 and R9 is coupled via a switch 40, and the junction of resistors R7 and R9 is coupled via a switch 42, to the positive input of an offset buffer 44. The output of buffer 44 is coupled by a resistor R10 to the negative input of preamplifier 18. A filter capacitor C4 is connected in shunt with resistors R8 and R9. The transducer is of bridge circuit configuration, which is excited by a suitable voltage which need not be floating. The excitation voltage is sensed by the divider network 11. The circuit of FIG. 1 is usually connected to the input signal source by a 4-wire cable, with two wires being connected to terminals 10 and 12 for receipt of the analog input signal and two other wires being connected to the input terminals of divider network 11 for sensing of the bridge excitation voltage. The interconnecting cable is floating with respect to ground, and all wires of the cable are subject to the same hum pickup or other spurious signal conditions.

The switches are typically CMOS solid state switches operative in response to an applied signal to provide conductive and non-conductive switching states. Other switching devices can, of course, be employed to suit various embodiments. Control signals $\phi_0$, $\overline{\phi_0}$, $\phi_2$ and $\overline{\phi_2}$ for the switches are provided by switch control logic 50 governed by a system clock 52 and which can be implemented in well known manner to provide the intended control voltages in intended time sequence. The control logic 50 also coupled the output of comparator 28 to control counter 54 which provides the digital output signal.

Figure 2A:
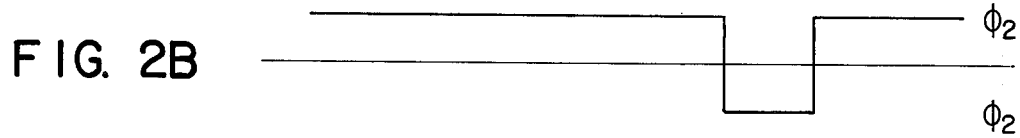
Figure 2B:
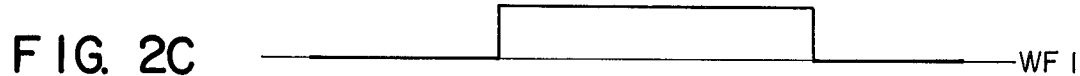
Figure 2E:
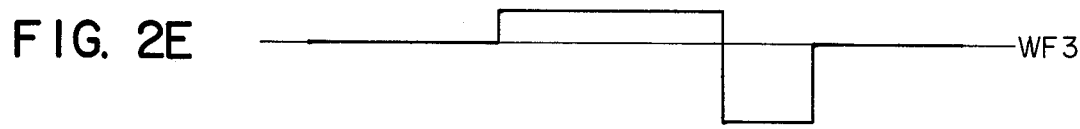
Figure 2F:

The operation of the embodiment of FIG. 1 will be explained in conjunction with the wavefoms of FIGS. 2A-2G. The conversion cycle includes 3 time periods; $T_0$ during which autozero action takes place to compensate for internal circuit errors and to intialize the circuit to a zero or reference state, $T_1$ which is the measurement interval of predetermined time during which the dual slope converter integrates from the reference state to an indeterminate final value, and $T_2$ which is the reference integration interval of a duration representative of the magnitude of the input signal and from which interval is derived the digital output. During time interval $T_0$, control logic 50 provides control signals $\phi_0$ and $\overline{\phi}_2$ causing conduction of switches 16, 20, 30, 36 and 40. During interval $T_1$, control signals $\overline{\phi}_0$ and $\overline{\phi}_2$ are provided by control logic 50 causing conduction of switches 14, 20 and 42. During the interval $T_2$, the control logic provides signals $\overline{\phi}_0$ and $\phi_2$ causing conduction of switches 14, 34 or 38 and 42. The switch 34 or 38 is rendered conductive in accordance with the polarity of the reference signal required. The complementary signals $\phi_0$ and $\overline{\phi}_0$ are shown in FIG. 2A, while FIG. 2B shows the complementary signals $\phi_2$ and $\overline{\phi}_2$. The waveforms WF1–WF5 of FIGS. 2C through 2G are as seen at the correspondingly labeled points of the circuit of FIG. 1.

Figure 2G:

During the autozero time period $T_0$, switch 16 is on causing application of the low side of an input signal to preamplifier 18. Switch 40 is also on causing application of the center tapped voltage from the divider network 11 to offset buffer 44 and thence to the negative input of preamplifier 18. Switch 20 is also on to permit coupling of the output of preamplifier 18 to the capacitor C1 and thence to the input of buffer 22. Switch 36 is also on during this autozero period to couple the center tapped voltage from the divider network to capacitor C3. The feedback loop of dual slope converter 24 is operative by reason of the conduction of switch 30. The buffer 22, integrator 26 and comparator 28 operate with the negative feedback path as a very high gain amplifier having negative feedback to cause the output of comparator 28 to be maintained at a substantially zero voltage level as shown in FIG. 2G. Noise signals may be present about the zero level but do not materially affect circuit performance. During interval $T_0$, capacitor C1 is charged to a voltage which compensates for any offset errors in preamplifier 18, buffer amplifiers 32 and 44 and dual slope converter 24 and also for the effect of common mode input voltage. Capacitor C3 is charged to a voltage representative of any errors in converter 24 and in the divider network 11 as well as any reference common mode voltage. Thus, all sources of initial circuit errors which could affect the analog-to-digital accuracy are stored for compensation out of the subsequent digital conversion.

During the measurement interval $T_1$, switch 14 is activated to couple the high side of the input signal to preamplifier 18 causing the preamplifier output to change by an amount equal to the difference between the high and low values of the differential input signal multiplied by the preamplifier gain. A reference signal is applied from the divider network by means of switch 42 to offset buffer 44 to provide a predetermined offsetting current into preamplifier 18. As a result, the preamplifier output will represent the magnitude of the differential input signal minus the predetermined offset. This preamplifier output signal is applied via capacitor C1 to buffer 22, and this input signal is free of offset and other internal circuit errors, as these errors have been previously compensated out during the autozero period $T_0$.

The feedback loop around converter 24 is disconnected by means of switch 30 during time interval $T_1$ and integrator 26 provides an integrated signal (FIG. 2F) for the duration of this interval. The interval $T_1$ is precisely controlled by the system clock 52 to be of predetermined duration, typically 200 milliseconds. The magnitude of the integrated signal at the end of interval $T_1$ is proportional to the magnitude of the input signal. During interval $T_2$, a reference signal is applied via switch 34 (or 38) to capacitor C3 and thence to buffer 22 for the reference integration during which the output signal from integrator 26 is discharged at a predetermined rate to its initial level as detected by comparator 28. The interval $T_2$ is of a duration proportional to the magnitude of the input signal. Clock 52 provides pulses to counter 54 during interval $T_2$, the final count being the digital representation of the analog input signal. Upon detection by the comparator that the integrator voltage has reached its intitial level, comparator 28 provides an output signal (FIG. 2G) denoting the end of interval $T_2$. After termination of interval $T_2$, the circuit returns to an autozero period $T_0$ for initialization for the next conversion cycle.

It will be appreciated that the converter employs a floating reference provided by amplifier 32 which derives this reference from input 12. In addition, an offset is provided for the converter by an offset signal derived from the sensed excitation voltage and applied to preamplifier 18, thereby to compensate for an input related offsetting condition, such as the platform weight of an electronic scale.

The invention is not to be limited by what has been particularly shown and described except as indicated in the appended claims.

What is claimed is:

1. For use with a transducer providing a low level differential analog signal representative of a sensed condition, said signal providing a first, lower voltage level and a second, higher voltage level relative to each other, a ratiometric analog-to-digital converter comprising:
   an autozeroed dual slope analog-to-digital converter circuit operative to provide a digital representation of said differential analog signal;
   the dual slope analog-to-digital converter being of the type which performs an autozero calibration during a first interval, integrates at a rate determined by an input signal during a second interval, and integrates at a rate determined by a reference signal during a third interval;
   a differential preamplifier;
   differential input switch means for coupling the first and second levels of said differential analog signal respectively during the first and second intervals to one input of said preamplifier;
   first means for selectively capacitively coupling the output of said preamplifier to the input of said converter circuit during said first and second intervals;
   reference means operative to differentially sense the excitation of said transducer and provide reference and offset signals to said converter circuit; and
   second means for selectively coupling during said first interval said reference means to the input of said converter circuit for analyzing said offset signal thereto, and for coupling during said third interval a reference signal to the input of said converter circuit which reference signal is integrated by said converter circuit.

2. A converter according to claim 1 wherein said differential input switch means includes:
   first and second switch means each operative to receive a respective level of said differential analog signal and each operative in response to a reactive control signal to convey the associated received signal to said preamplifier;
   said first switch means being conductive during the first time interval to cause application of the lower voltage level of said differential analog signal to said preamplifier; and said second switch being operative during the second time interval to cause application of the higher voltage level of said differential analog signal to said preamplifier.

3. A converter according to claim 2 wherein said first means includes:

first capacitor means for storing a voltage representative of circuit error; and third switch means operative in response to a control signal to couple the output of said preamplifier to said first capacitor means.

4. A converter according to claim 3 wherein said second means includes:

second capacitor means for storing a voltage representative of circuit error and;

fourth switch means operative in response to control signals for coupling reference and offset signals to said second capacitor means.

5. A converter according to claim 4 further including buffer means coupling one input of said differential analog signal to said converter circuit and said preamplifier to serve as a reference signal.

6. A converter according to claim 2 wherein said reference means includes:

switch means for deriving reference signals from said excitation; and means for applying said reference signals to said preamplifier as an offset therefor.

7. The converter of claim 1 further including means for applying reference and offset signals from said reference means to said preamplifier means during said first and second intervals to add a predetermined offset signal to said differential input signal.

8. The converter of claim 7 wherein said means for applying a reference signal includes:

means for storing a common mode signal representative of the common mode value of said excitation signal during said autozero cycle; and means for combining said common mode signal with a reference signal during said reference cycle and for applying the combined signal to the input of said autozero converter.

9. An analog-to-digital converter comprising:

an autozero dual slope analog-to-digital converter circuit;

the dual slope analog-to-digital converter circuit being of the type which performs an autozero calibration during a first interval, integrates at a rate determined by an input signal during a second interval, and integrates at a rate determined by an integrating reference signal during a third interval;

a differential preamplifier having first and second input terminals;

differential input switching means for selectively coupling a differential analog input signal to said preamplifier and including:

first and second switch means for receiving respective first and second input of said differential analog input signal and for respectively coupling said first and second inputs to the first input terminal of said preamplifier during said first and second intervals;

means coupling the output of said preamplifier to the input of said dual slope circuit and including:

first capacitor means having one terminal connected to the input of said dual slope circuit; and third switch means for selectively coupling the output of said preamplifier to the other terminal of said first capacitor means during said first and second intervals;

means for sensing a differential excitation signal for deriving reference signals from said excitation signal;

second capacitor means having one terminal connected to the input of said dual slope circuit;

first means for selectively coupling a first reference signal from said sensing means to the second terminal of said second capacitor means during said first interval, and for coupling a second reference signal to the second terminal of said second capacitor means during said third interval to provide said integrating signal to said dual slope circuit;

second means for selectively coupling reference signals from said sensing means during said first and second intervals to the second terminal of said preamplifier to provide a predetermined offset signal therefor;

buffer means coupling the first input of said input switching means to said second input terminal of said preamplifier and to said dual slope circuit to provide a reference signal therefor; and means for providing a digital signal representation of the magnitude of said analog input signal.

10. A converter according to claim 9 wherein said second means includes:

fourth and fifth switch means for coupling respective reference voltages derived from said sensing means to said preamplifier to provide an offset signal therefor.

11. A converter according to claim 10 wherein said fourth and fifth switch means are respectively operative during the first and second intervals to provide said offset signal.

12. The converter of claim 9 wherein said first reference signal is a signal representative of the common mode value of said differential excitation signals.

13. An analog-to-digital converter comprising:

an autozero analog-to-digital converter having an input and being of the type having an autozero cycle during which the converter input is driven towards a reference level, a measurement cycle during which an unknown signal applied to the input is measured, and a reference cycle during which a reference signal applied to the input is measured and producing a digital representation of the ratio between the unknown input signal and the reference signal;

input means for receiving a differential input signal;

buffer means for providing the reference level to the autozero analog-to-digital converter in response to the value of the differential input signal;

reference means for sensing a differential excitation signal and for deriving reference signals therefrom;

means operative in response to said differential input signal, and said reference signals for storing during said autozero cycle at least one correction signal representative of offset errors in the input means, the buffer means, and the autozero analog-to-digital converter;

means for combining said correction signal and said differential input signal during said measurement cycle and for applying the combined signal to the input of said autozero analog-to-digital converter; and means for applying a reference signal from said reference means to the input of said autozero converter during said reference cycle.

* * * * *

UNITED STATES PATENT OFFICE
CERTIFICATE OF CORRECTION

PATENT NO. : 4,031,533
DATED : June 21, 1977
INVENTOR(S) : Leopold Neumann

It is certified that error appears in the above-identified patent and that said Letters Patent are hereby corrected as shown below:

Column 2, line 53, "coupled" should be --couplers--.

Column 2, line 60, "intialize" should be --initialize--.

Column 4, line 64, "reactive" should be --respective--.

Signed and Sealed this

Sixth Day of June 1978

[SEAL]

Attest:

RUTH C. MASON
Attesting Officer

DONALD W. BANNER
Commissioner of Patents and Trademarks